United States Patent [19]

Ohhara et al.

[11] Patent Number: 4,828,876

[45] Date of Patent: May 9, 1989

[54] PRODUCTION OF PHOTOELECTRIC CONVERSION FILM AND CONTACT TYPE IMAGE SENSOR

[75] Inventors: Soji Ohhara, Kashihara; Satoshi Nishigaki; Shuhei Tsuchimoto, both of Nara; Ryusuke Kita, Tenri, all of Japan

[73] Assignee: Sharp Kabushiki Kaisha, Osaka, Japan

[21] Appl. No.: 825,925

[22] Filed: Feb. 4, 1986

[30] Foreign Application Priority Data

Feb. 6, 1985 [JP] Japan .................................. 60-22194
Feb. 12, 1985 [JP] Japan .................................. 60-25833
Feb. 13, 1985 [JP] Japan .................................. 60-27392
Feb. 18, 1985 [JP] Japan .................................. 60-30765
Feb. 19, 1985 [JP] Japan .................................. 60-33597

[51] Int. Cl.4 .............................................. B05D 5/12
[52] U.S. Cl. ..................................... 427/76; 427/74; 427/75
[58] Field of Search ................................. 427/74–76

[56] References Cited

U.S. PATENT DOCUMENTS

| 4,368,216 | 1/1983 | Manassen | 427/76 |
| 4,609,567 | 9/1986 | Toth | 427/74 |
| 4,650,985 | 3/1987 | Okibayashi | 250/211 R |
| 4,701,997 | 10/1987 | Kita et al. | 427/76 |
| 4,735,909 | 4/1988 | Albright et al. | 427/74 |
| 4,759,951 | 7/1988 | Itoh et al. | 427/74 |

Primary Examiner—Norman Morgenstern
Assistant Examiner—M. L. Padgett
Attorney, Agent, or Firm—Birch, Stewart, Kolasch, & Birch

[57] ABSTRACT

A process for preparing a photoelectric conversion film containing one or more compound semiconductor made from Cd and group Vi element comprises coating a paste containing (a) a photoelectric conversion material, (b) a dopant, (c) a flux, (d) an organic binder, and optionally (e) a glass frit on a substrate, and sintering it at 300° C.–800° C. in an inert gas blanket.

18 Claims, 2 Drawing Sheets

PRODUCTION OF PHOTOELECTRIC CONVERSION FILM AND CONTACT TYPE IMAGE SENSOR

FIELD OF THE INVENTION

The present invention relates to a process for preparing a long or wide photoelectric conversion film suitable for a contact type image sensor.

BACKGROUND OF THE INVENTION

A linear image sensor is used for an input device of a picture in an office automation apparatus, such as a facsimile, an intelligent copper and the like. In a conventional image element, picture information generally is obtained from a (CCD type or MOS type) linear solid image sensor by way of exposing a picture through a slit to light and focusing it into image in a smaller scale. The linear solid image element usually has a size of about 30 mm, which is produced by IC technique. However, since the element must adopt an optical system having a long optical path length for introducing reflected light from a manuscript to a receiving part, it is difficult to miniaturize the apparatus. In addition, these types of devices require complicated adjustment of a light path. They may raise problems such as reduction of luminous energy on an edge portion of picture, decline of a resolution and the like.

For improving the above problems, there have been proposed contact type image sensors which have the same size as manuscripts in length and which contactly focus into image by a fiber lens array. In the contact type image sensors, photoelectric conversion parts have to be made large and uniform.

Presently, for producing long size image sensors, amorphous silicon thin film has been used, but, in these silicon image elements, a strange reading process is required because rising current from the silicon thin film is very weak. For rapid reading, the number of required switches increase, which make the device costly.

On the other hand, contact type image elements using CdSe compound semiconductor as a photoelectric film, can provide signal outputs at a high level, which makes it possible to adopt a real-time reading process. In addition, it makes possible a matrix device and the number of switch elements decrease, which are merits of these types image elements. However, though the photoelectric film is usually formed by vacuum evaporation, it is difficult to obtain reproducibility because a chemical composition can vary by producing conditions.

SUMMARY OF THE INVENTION

The present invention provides an improved process for preparing a photoelectric conversion film containing one or more compound semiconductors made from Cd and a VI group element. The process comprises forming a paste by mixing
(a) a photoelectric conversion material containing Cd and a VI group element,
(b) a dopant,
(c) a flux,
(d) an organic binder, coating the paste on a substrate, and heating the coated substrate at 300° C. to 800° C. in an inert gas blanket.
The paste may additionally contain glass frit having low melting point for sintering.

The present invention provides a contact type image element prepared by the process mentioned above, which has excellent characteristics.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from is detailed description.

BRIEF EXPLANATION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PRESENT INVENTION

Figure 1:
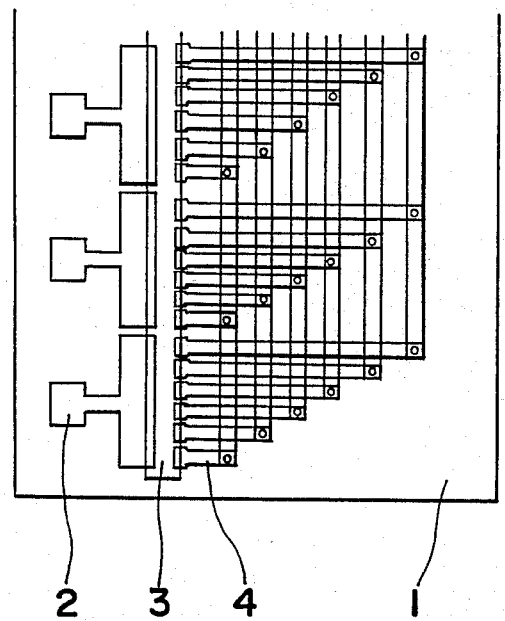
FIG. 1 shows one embodiment of the contact type image element equipped with the photoelectric conversion film prepared by the process of the present invention.
Figure 2:
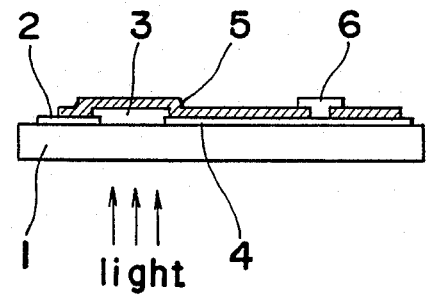
FIG. 2 shows a sectional view of the image element of FIG. 1.

The photoelectric conversion material of the present invention generally equals to a compound semiconductor which contains Cd and group VI element. Examples of group VI elements are S, Se, and Te. Preferred are S and Se, because they are easily obtained. The compound semiconductors may be obtained as particle by a chemical deposition. The chemical deposition is well-known. Particle size of the photoelectric conversion material is preferably from 0.5 to 10 μm. Particle sizes less than 0.5 μm are not desirable because crystal structure is not stable, and particle sizes more than 10 μm are not desirable because packing density and homogeneity may be not enough. The photoelectric conversion material is preferably pretreated for activation by generally heating at a temperature of 500° to 900° C., preferably 600° to 800° C., for 10 minutes to 3 hours, preferably 15 minutes to 60 minutes. The activation is carried out for enhancing photoconductive characteristics.

The dopant of the present invention is chlorided of Cu, Ag and Al. The amount of the dopant is from 100 to 2000 wt ppm, preferably from 100 to 1000 wt % based on the weight of the paste. The dopant can formulate into the photoelectric conversion material mentioned above by the chemical deposition.

The flux of the present invention is preferably $CdCl_2$, but other material, for example, $ZnCl_2$ can be employed. The amount of the flux is from about 0.5 to 10 wt %, preferably 4 to 8 wt % based on the weight of the paste.

For making the paste by mixing the components mentioned above, the organic binder is formulated. Examples of the organic binders are ethylene glycol, ethyl cellulose, α-terpineol, and a mixture thereof. The amount of the organic binder is not limited. It may be sufficient amount to give a suitable viscosity to the paste.

Besides the components mentioned above, the paste of the present invention may contain a glass frit having low melting point, for example 300° to 450° C. The glass frit enhances binding power. The amount of the glass frit is 0.01 to 25 wt %, preferably 2 to 20 wt %, more preferably 0.5 to 5 wt % based on the weight of the paste.

The paste can be obtained by mixing the above components in a mill, such as a ball mill or a sand mill, for about 1 to 200 hours. The paste generally has a viscosity suitable for coating.

The photoelectric conversion film can be prepared by coating the paste mentioned above on the substrate and sintering at temperature of 300° to 800° C., preferably 400° to 600° C. The coating can be carried out by using a printing technique, for example a screen process printing and the like. When the activation of the photoelectric conversion material is not carried out, the temperature of sintering is relatively high, because the activation is simultaneously effected. When the activation is already carried out, the temperature is relatively low. Before sintering, the substrate may be pre-heated to a suitable temperature, and then the sintering will be done at a desirable temperature.

The present invention also encompasses a contact type image element equipped with the photoelectric conversion film prepared by the above process. The contact type image element illustrates based on the drawings.

An insulation substrate 1 is available from Corning Co. Ltd. On the substrate 1, a co-electrode 2 is formed by evaporation, especially an electron beam evaporation. Then the photoelectric conversion film 3 is formed on the co-electrode by the process mentioned above. And an independent electrode 4, an insulation layer 5, and a matrix wiring 6 are subsequently formed on the photoelectric conversion film 3.

Figure 3:
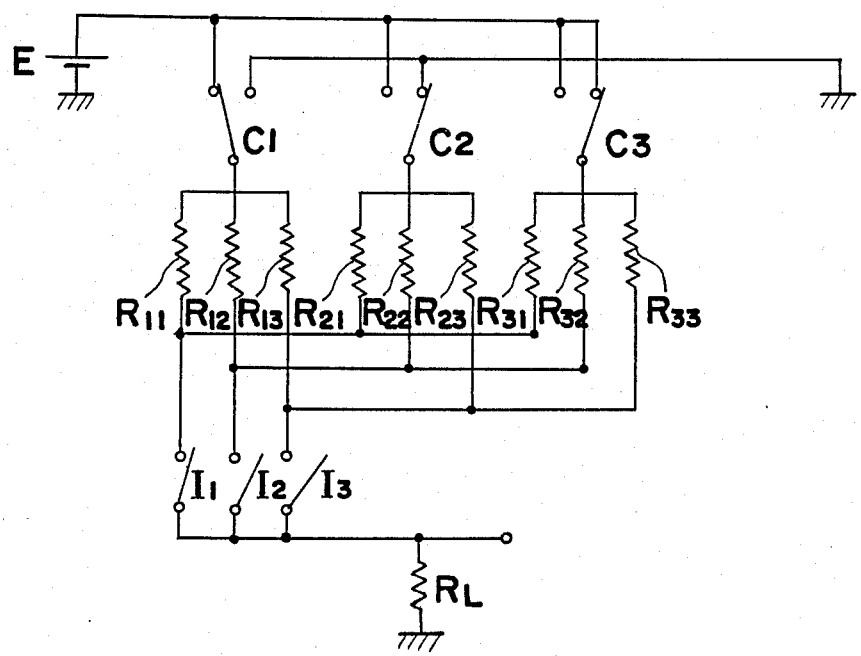
FIG. 3 shows a circuit of the contact type image sensor of the present invention.

An example of a circuit of the image element is illustrated in FIG. 3. in FIG. 3, $R_{11}$, $R_{12}$ to $R_{33}$ represent photoelectric conversion film, $C_{1-3}$ represent co-electrodes, $I_1$ to $I_3$ represent independent switches, E represents a power supply and $R_L$ represents a load resistance.

The photoelectric conversion film of the present invention can be easily formed by a print technique and therefore the thickness of it can adjust 5 to 20 μm to easily divide picture element when leak can arise between adjacent picture elements.

The contact type image element of the present invention does not require a blocking diode for preventing cross-talk. It also reduces the number of switching elements because matrix wiring is adopted to minimize a cost for production.

The present invention will illustrate based on the following examples.

EXAMPLE 1

Figure 4:
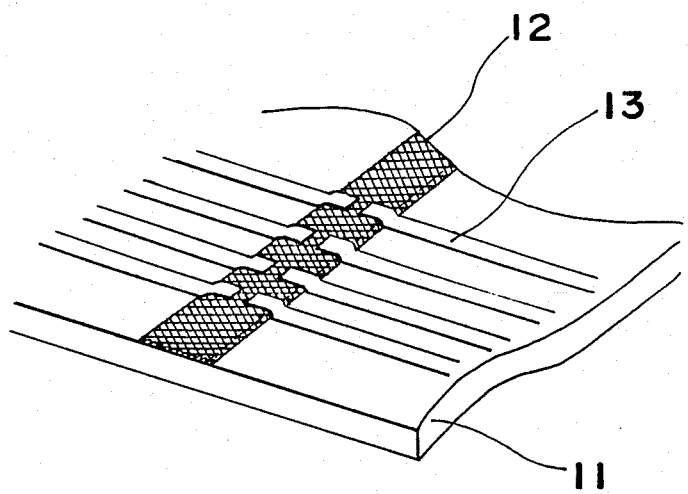
FIG. 4 shows a perspective view of the photoelectric conversion element prepared by the present example.

FIG. 4 shows a perspective view of the photoelectric conversion element prepared by the present example.

In the present example, the photoelectric conversion material was CdS and CdSe, which were obtained by a conventional chemical deposition. CdS compound particles and CdSe compound particles were coprecipitated to form a mixture. The mixing ratio of the CdS compound to the CdSe compound was from 0.4 to 0.8/1. 15 wt% of $CdCl_2$, 10 wt% of a glass frit having the melting point of 400° C., 0.5 wt% of $CuCl_2$ and a suitable amount of alpha-terpineol containing a small amount of ethyl cellulose were added to the mixture of the CdS compound and the CdSe compound and mixed for 10 hours in a ball mill to form a paste for coatings. The paste was applied on a ceramic substrate 11 having smooth surface by a screen process printing. The resultant substrate was heated at 150° C. for 30 minutes, at 300° C. for 30 minutes and at 600° C. for one hour in $N_2$ gas blanket to form a photoelectric conversion film 12 having the thickness of 15 μm on the substrate 11.

The photoelectric conversion film 2 was observed by an electron microscope to find that the particles grew to a particle size of 5 micrometer and the grown particles were covered with low melting point glass to prevent excess binding thereof. It was evidenced by X-ray diffraction that the photoelectric conversion film had a solid solution construction of hCp.

On the resultant substrate 11, planar type electrodes (Cr) 13 were formed at the length of 60 μm at intervals of 25 μm by a lift-off process as shown in FIG. 4 to obtain a photoelectric conversion element. Photoresistance of the element was measured under a light emitting diode (illuminance=30 lx). An average photoresistance to the planar type electrodes was $1.3 \times 10^7 \omega$ and the modulation factor was 20 when the optical pulse of 100 Hz was applied.

EXAMPLE 2

In the present example, the photoelectric conversion material was CdS and CdSe, which were obtained by a conventional chemical deposition. CdS compound particles and CdSe compound particles were coprecipitated to form a mixture. During the coprecipitation, Cu, Ag or Al was simultaneously mixed by the coprecipitation. The amount of dopant was 450 to 2,500 ppm when Cu was employed, 40 to 1,500 ppm when Ag was employed and 650 to 1,500 ppm when Al was used. The mixing ratio of the CdS compound to the CdSe compound was from 0.4 to 0.8/1. The mixture was activated by heating at 500° to 900° C. for 15 minutes in $N_2$ blanket to form particles having a particle size of 0.5 to 10 μm.

0.5 to 5 wt% of $CdCl_2$, 2 to 20 wt% of glass frit having a melting point of 300° to 450° C., and a suitable amount of ethylene glycol or ethyl cellulose were added to the mixture and mixed for 10 hours in a ball mill to form a paste for coatings.

The paste was applied on a smooth surface ceramic substrate 11 by a screen process printing. The resultant substrate was heated to 360° C. at the rate of 5° C./min and at 360° C. it was maintained for one hour in $N_2$ gas blanket. It was additionally heated at 450° C. for 30 minutes in $N_2$ gas blanket to form a photoelectric conversion film 12 having the thickness of 15 micrometer on the substrate 11.

Figure 5:
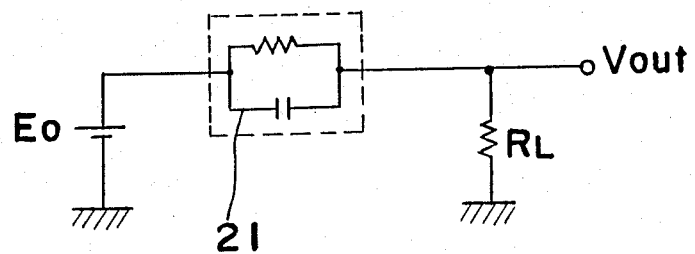
FIG. 5 shows a circuit for evaluation of the element of FIG. 4.

On the resultant substrate 11, planar type electrodes (Cr) 13 were formed at the length of 100 μm at intervals of 50 μm by a lift-off process as shown in FIG. 4 to obtain a photoelectric conversion element. FIG. 5 shows a circuit for evaluating the obtained element. In FIG. 5, 21 is an equivalent circuit of the photoelectric conversion film, $E_0$ is a power source of 12 Volt, $R_L$ is a load resistance of 10 kΩ and Vout is an output. By using this circuit, the following characteristics were measured;

(1) Out-put under light of an light emitting diode having the central wave length of 565 nm (illuminance=30 lx)—(Vout(L))
(2) Output without light (Vout(D))
(3) Rate of Vout(L)/Vout(D)
(4) Speed of response when optical pulses of 100 Hz was applied (Rise; Tr(0 to 90%): Fall; Tf(100% to 10%).

The result of the above mentioned test and the conditions for making the elements are shown in Table 1.

EXAMPLE 3

The present example employed only CdSe which was obtained by a chemical deposition. A dopant, Cu or Ag, was simultaneously deposited with CdSe compound semiconductor. The amount of the dopant was the same as Example 2. The mixture of the compound semiconductor and the dopant was activated at 800° C. for 30 minutes in $N_2$ gas blanket. The average particle size of the obtained mixture was 4 μm.

TABLE 1

| sample | Compounding ratio of Cds | Dopant | Doping amount (ppm) | Composition ratio of glass | Glass transition temperature | Binder | Vount (L)/ mV | Vount (D)/ mV | Vount (L)/ Vount (D) | Tr (0 → 90%) | Tf (100% → 10%) |
|---|---|---|---|---|---|---|---|---|---|---|---|
| A | 0.4 | Cu | 1400 | 5 wt % | 315° C. | Ethyl cellulose | 34.5 | 1.0 | 34.5 | 1.9 | 1.9 |
| B | 0.7 | " | " | " | " | Ethyl cellulose | 23.7 | 0.9 | 26.3 | 3.1 | 3.9 |
| C | 0.4 | Ag | 900 | " | 370 | Ethyl cellulose | 9.3 | 1.1 | 8.5 | 8.8 | 2.0 |
| D | 0.7 | " | " | " | " | Ethyl cellulose | 6.5 | 0.7 | 9.3 | 7.5 | 17.5 |
| E | 0.4 | Cu | 450 | " | 370 | Ethyl cellulose | 2.8 | 0.8 | 3.5 | 3.9 | 2.9 |
| F | 0.7 | " | " | " | " | Ethyl cellulose | 2.6 | 1.1 | 2.4 | 25.3 | 85.9 |
| G | 0.4 | Ag | 1500 | " | 315 | Ethyl cellulose | 13.7 | 0.5 | 27.4 | 2.9 | 2.9 |
| H | 0.7 | " | " | " | " | Ethyl cellulose | 7.9 | 0.09 | 87.8 | 1.9 | 6.8 |
| I | 0.4 | Al | 1000 | " | " | Ethyl cellulose | 15.1 | 0.4 | 37.8 | 3.5 | 4.3 |
| J | 0.7 | " | " | " | " | Ethyl cellulose | 10.9 | 0.3 | 35.0 | 6.2 | 8.7 |

As shown in Table 1, the photoelectric conversion films of the present invention have excellent electric characteristics. Samples C, D, E and H do not indicate good characteristics in comparison with the other films, but they are still useful for image element.

A paste was prepared as generally described in Example 2 and applied to a substrate. The resultant substrate was heated to 310° C. at the rate of 5° C./min and at 310° C. it was maintained for one hour, and then it was heated at 550° C. for 30 minutes to obtain a photoelectric conversion film. The characteristics of the obtained film were measured as Example 2. The result and conditions for preparation are shown in Table 2.

TABLE 2

| sample | Dopant | Doping amount (ppm) | Composition ratio of glass | Glass transition temperature | Composition ratio of $CdCl_2$ | Binder | Vount (L)/ mV | Vount (D)/ mV | Vount (L)/ Vount (D) | Tr (0 → 90%) | Tf (100% → 10%) |
|---|---|---|---|---|---|---|---|---|---|---|---|
| A | Cu | 700 | 10 wt % | 450° C. | 7 wt % | Ethylene glycol | 75.0 | 1.2 | 62.5 | 3.3 | 1.7 |
| B | " | 1500 | " | " | " | Ethylene glycol | 74.3 | 0.9 | 82.6 | 1.5 | 0.1 |
| C | " | 700 | 5 | " | " | Ethylene glycol | 91.2 | 1.8 | 50.7 | 3.8 | 1.5 |
| D | " | 1500 | " | " | " | Ethylene glycol | 95.5 | 1.5 | 63.7 | 1.2 | 0.1 |
| E | Ag | 1000 | 10 | " | 10 | Ethylene glycol | 10.2 | 0.7 | 14.6 | 3.4 | 2.8 |
| F | " | 2000 | " | " | " | Ethylene glycol | 16.4 | 0.3 | 54.3 | 3.0 | 1.6 |
| G | " | 1000 | 5 | " | " | Ethyl- | 41.8 | 1.1 | 38.0 | 1.5 | 0.1 |

TABLE 2-continued

| sample | Dopant | Doping amount (ppm) | Composition ratio of glass | Glass transition temperature | Composition ratio of CdCl₂ | Binder | Vount (L)/ mV | Vount (D)/ mV | Vount (L)/ Vount (D) | Tr (0 → 90%) | Tf (100% → 10%) |
|---|---|---|---|---|---|---|---|---|---|---|---|
| H | " | 2000 | " | " | " | ene glycol Ethylene glycol | 46.2 | 0.8 | 57.8 | 1.6 | 0.1 |

EXAMPLE 4

An insulation substrate, which was available from Corning Co. Ltd as #7059, was heated to 200° C. At 200° C., Ti thin film layer was formed in a thickness of about 2000 Å by an electron beam evaporation and etched by a photolithography process to form a picture element (linear density=8 dots/mm) and a lower matrix wiring. A paste for a photoconductive film was made by mixing CdSe powder having a particle size 0.5 to 5 μm (average particle size=about 2 μm), which was doped by CuCl₂ of 0.4 mole %, 6 mole % of CdCl₂, 4 wt% of a low melting point (400° C.) glass and a suitable amount of an oil containing alpha-terpineol and ethyl cellulose for 24 hours in a ball mill. The paste was applied on the picture element of the wired substrate by a screen process print and then heated at 300° C. for one hour and at 600° C. for 30 minutes in N₂ blanket. Then a polyimide insulation layer was formed on the picture element and the matrix wiring by a sputtering and a contact hole was formed on the matrix wiring by a plasma etching. Cr metal was coated on the substrate in thickness of 2,000 Å by an electron beam evaporation, followed by forming the upper wiring by a photolithography, which was an element composed of 1728 picture elements.

The element had the bias voltage of 12 V, the output current of 8 μA to incident light of 30 lx and uniformity of the picture elements of ±10%. The response time of the element was not more than 2 m sec, which indicated excellent properties. By using this contact type image element, a real time reading process can be performed.

EXAMPLE 5

An insulation substrate, which was available from Corning Co. Ltd as #7059, was heated to 150° C. At 150° C., Ti thin film layer was formed in a thickness of about 3000 Å by an electron beam evaporation and etched by a photolithography process to form a picture element (linear density=8 dots/mm) and a lower matrix wiring. A paste for a photoconductive film was made by mixing pre-activated CdSe powder having a particle size 0.5 to 5 μm (average particle size=about 2 μm), which was doped by CuCl₂ of 0.4 mole %, 12 mole % of CdCl₂ and a suitable amount of ethylene glycol for 200 hours in a ball mill. The pre-treatment was carried out by heating at 800° C. in N₂ blanket. The paste was applied on the picture element of the wired substrate by a screen process print and then heated at 100° C. for one hour, at 300° C. for one hour and at 500° C. for 30 minutes in N₂ blanket. Then SiO₂ insulation layer was formed on the picture element and the matrix wiring by a sputtering and a contact hole was formed on the matrix wiring by a plasma etching. Aluminum was coated on the substrate in thickness of 2,000 Å by an electron beam evaporation, followed by forming the upper wiring by a photolithography, which was an element composed of 1728 picture elements.

The element had the bias voltage of 12 V, the output current of 7 μA to incident light of 64 micro-watt/cm² and uniformity of the picture elements of ±10%. The response time of the element was not more than 2 m sec, which indicated excellent properties. By using this contact type image sensor, a real time reading process can be performed.

EXAMPLE 6

A contact type image sensor was made as generally described in Example 4 with the exception that CdSe powder was pre-activated by heating at 800° C. in N₂ blanket and the sintering was carried out by heating at 300° C. for one hour and 500° C. for 30 minutes.

The element had the bias voltage of 12 V, the output current of 8 μA to incident light of 30 lx and uniformity of the picture elements of ±10%. The response time of the element was not more than 2 m sec, which indicated excellent properties. By using this contact type image sensor, a real time reading process can be performed.

EXAMPLE 7

A contact type image sensor was prepared as generally described in Example 6 with the exception that the amount of the low melting point glass was changed to 15 wt% from 4 wt%. The sensor had bias voltage of 12 V and output current of 4 μA, but the response time for rise was 40 m sec, which was not good in comparison with the element of Example 6.

EXAMPLE 8

A contact type image sensor was prepared as generally described in Example 4 with the exception that activation was carried out by heating at 800° C. in N₂ blanket and the sintering was carried out by heating at 600° C. for 30 minutes instead of 500° C. for 30 minutes. The element had bias voltage of 12 V, output current of 1 μA under 30 lx and response time of 5 m sec, but light and shade contrast decreased.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for preparing a photoelectric conversion film used for a contact type image sensor, said film containing one or more semiconductor compounds made from Cd and a group VI element, comprising the steps of: forming a paste by mixing
    (a) photoelectric conversion material containing Cd and a group VI element,
    (b) a dopant,
    (c) a flux, and (d) an organic binder selected from the group consisting of ethylene glycol, ethyl cellulose, alpha-terpineol and a mixture thereof;

coating said paste on a substrate; and heating the coated substrate at 300° C. to 800° C. in an inert gas blanket.

2. The process of claim 1 wherein the photoelectric conversion material is CdSe compound particles.

3. The process of claim 2 wherein the photoelectric conversion material is subjected to a pretreatment for activation.

4. The process of claim 3 wherein the pretreatment is a heating treatment at 600° C. to 800° C. for 30 to 60 minutes.

5. The process of claim 1 wherein the paste additionally contains (e) a glass frit having low melting temperature.

6. The process of claim 1 wherein the dopant is selected from the group consisting of $CuCl_2$, $AgCl_2$ and $AlCl_2$.

7. The process of claim 1 wherein the flux is $CdCl_2$.

8. The process of claim 5 wherein the melting point of the glass frit is from 300° C. to 450° C.

9. The process of claim 1 wherein the inert gas is $N_2$ gas.

10. A process for preparing a contact type image sensor comprising the steps of:

preparing a photoelectric conversion film including the steps of:

(a) forming a paste mixing (i) photoelectric conversion material containing Cd and a group VI element, (ii) a dopant, (iii) a flux, and (iv) an organic binder selected from the group consisting of ethylene glycol, ethyl cellulose, alpha-terpineol, and a mixture thereof;

(b) coating the paste on a substrate; and (c) heating the coated substrate at 300° C. to 800° C. in an inert gas blanket; and using said photoelectric conversion film in a contact image sensor.

11. The process of claim 10 wherein the photoelectric conversion material is CdSe compound particles.

12. The process of claim 11 wherein the photoelectric conversion material is subjected to a pretreatment for activation.

13. The process of claim 12 wherein the pretreatment is a heating treatment at 600° C. to 800° C. for 30 to 60 minutes.

14. The process of claim 10 wherein the paste additionally contains (v) a glass frit having a low melting temperature.

15. The process of claim 10 wherein the dopant is selected from the group consisting of $CuCl_2$, $AgCl_2$ and $AlCl_2$.

16. The process of claim 10 wherein the flux is $CdCl_2$.

17. The process of claim 14 wherein the melting point of the glass frit is from 300° C. to 450° C.

18. The process of claim 10 wherein the inert gas is $N_2$ gas.

* * * * *